US012132458B2

(12) United States Patent
Li et al.

(10) Patent No.: US 12,132,458 B2
(45) Date of Patent: Oct. 29, 2024

(54) LONG-TERM SIGNAL ESTIMATION DURING AUTOMATIC GAIN CONTROL

(71) Applicant: Zoom Video Communications, Inc., San Jose, CA (US)

(72) Inventors: Jianglong Li, Hangzhou (CN); Yu Rao, Sunnyvale, CA (US); Yangzhong Wang, Suzhou (CN)

(73) Assignee: Zoom Video Communications, Inc., San Jose, CA (US)

( * ) Notice: Subject to any disclaimer, the term of this patent is extended or adjusted under 35 U.S.C. 154(b) by 0 days.

(21) Appl. No.: 18/517,140

(22) Filed: Nov. 22, 2023

(65) Prior Publication Data

US 2024/0088856 A1 Mar. 14, 2024

Related U.S. Application Data (63) Continuation of application No. 17/573,628, filed on Jan. 11, 2022, now Pat. No. 11,863,143, which is a
(Continued)

(30) Foreign Application Priority Data

Feb. 8, 2021 (CN) .......................... 202110179609.X (51) Int. Cl.
*H03G 3/30* (2006.01)
*H04R 3/00* (2006.01)

(52) U.S. Cl.
CPC ............. *H03G 3/3005* (2013.01); *H04R 3/00* (2013.01); *H04R 2420/05* (2013.01); *H04R 2430/01* (2013.01)

(58) Field of Classification Search
CPC ........ H03G 3/3005; H03G 5/00; H03G 5/005; H03G 5/02; H03G 5/025; H03G 3/20;
(Continued)

(56) References Cited

U.S. PATENT DOCUMENTS

| 4,630,302 A | 12/1986 | Kryter |
| 5,016,205 A | 5/1991 | Shumway |

(Continued)

OTHER PUBLICATIONS

U.S. Appl. No. 17/573,628, "Non-Final Office Action", May 11, 2023, 11 pages.
(Continued)

*Primary Examiner* — Xu Mei
(74) *Attorney, Agent, or Firm* — Kilpatrick Townsend & Stockton LLP (57) ABSTRACT

Disclosed are systems and methods for generating a long-term signal level estimate during automatic gain control. In an example method, a computing device receives an input signal comprising feed data, the input signal derived from an upstream input signal. The computing device selects a first subset of the feed data and divides the first subset of the feed data into a plurality of analysis intervals. The computing device calculates a statistical average of each analysis interval and generates a first Gaussian distribution based on the statistical average of each analysis interval of the plurality of analysis intervals. Based on one or more characteristics of the first Gaussian distribution, the computing device determines the long-term signal level estimate, generates a first stage gain based on the long-term signal level estimate, and applies the first stage gain to the input signal.

20 Claims, 8 Drawing Sheets

Related U.S. Application Data continuation of application No. 17/187,773, filed on Feb. 27, 2021, now Pat. No. 11,258,416.

(58) Field of Classification Search
CPC .... H03G 3/3089; H04R 3/00; H04R 2420/05; H04R 2430/01
USPC ........................................ 381/104, 107, 109
See application file for complete search history.

(56) References Cited

U.S. PATENT DOCUMENTS

| | | | |
|---|---|---|---|
| 8,275,150 B2 | 9/2012 | Moon et al. | |
| 8,275,153 B2 | 9/2012 | Wei | |
| 8,582,786 B2 | 11/2013 | Kemmerer et al. | |
| 8,587,376 B2 | 11/2013 | Reining | |
| 8,787,595 B2 | 7/2014 | Urata | |
| 9,319,015 B2 | 4/2016 | Ikeda | |
| 9,391,575 B1* | 7/2016 | Yang | H03G 9/005 |
| 9,503,041 B1 | 11/2016 | Lee | |
| 10,778,168 B2* | 9/2020 | Coover | H04R 3/007 |
| 11,258,416 B1 | 2/2022 | Rao et al. | |
| 11,863,143 B2* | 1/2024 | Rao | H03G 3/3089 |
| 2014/0328500 A1* | 11/2014 | Patwardhan | H03G 5/005 381/107 |
| 2019/0190477 A1 | 6/2019 | Travaglini | |

OTHER PUBLICATIONS

U.S. Appl. No. 17/573,628, "Notice of Allowance", Aug. 28, 2023, 7 pages.

PCT/US2022/015158, "International Preliminary Report on Patentability", Aug. 17, 2023, 5 pages.

PCT/US2022/015158, "International Search Report and Written Opinion", Feb. 23, 2022, 7 pages.

\* cited by examiner

LONG-TERM SIGNAL ESTIMATION DURING AUTOMATIC GAIN CONTROL

CROSS-REFERENCE TO RELATED APPLICATION

This application is a continuation of U.S. application Ser. No. 17/573,628, filed Jan. 11, 2022 and allowed on Aug. 28, 2023, which is a continuation of U.S. application Ser. No. 17/187,773, filed Feb. 27, 2021 and granted on Feb. 22, 2022, which claims the benefit of Chinese Application No. 202110179609.X, filed Feb. 8, 2021, which are hereby incorporated by reference in their entirety.

FIELD

This application relates to the field of automatic gain control of speech during a video conferencing session.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Audio or video conferencing applications allow people to communicate with each other in remote locations through audio and video media in real time. In some instances, there is a desire to present obtain and transmit audio with a predictable and stable gain level in order to provide a pleasant and consistent audio in the receiver side.

SUMMARY

The appended claims may serve as a summary of this application.

BRIEF DESCRIPTION OF THE DRAWINGS

These drawings and the associated description herein are provided to illustrate specific embodiments of the invention and are not intended to be limiting.

DETAILED DESCRIPTION

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Unless defined otherwise, all terms used herein have the same meaning as are commonly understood by one of skill in the art to which this invention belongs. All patents, patent applications and publications referred to throughout the disclosure herein are incorporated by reference in their entirety. In the event that there is a plurality of definitions for a term herein, those in this section prevail. When the terms "one", "a" or "an" are used in the disclosure, they mean "at least one" or "one or more", unless otherwise indicated.

Overview

Video conferencing over a computer network has existed and has increasingly played a significant role in the modern workplace. With the advent of remote working and shelter-in-place mandates by various government agencies during the COVID-19 pandemic, the role of robust video conferencing systems have only become more critical. There are various components (local and remote) that work in unison to implement a video conferencing system. Typical video conferencing applications include a client-side application that can run on a desktop, laptop, smart phone or similar stationary or mobile computing device and can capture video and audio and transmit those to a recipient computer. It may be desirable to capture audio at a targeted level. To that end, gain control modules can be used to manipulate the received level of audio. This device would have to apply one or more gain parameters to the received audio signal in order to boost it or depress it to a target level. The gain control module may have to estimate a signal level, which can track the real signal level for present or future signal values. The estimated signal level can be used to generate one or more corresponding gain values to convert the received signal to a target level. The described embodiments include a two-stage automatic gain control (AGC) module, which can amplify an input signal to a target level, by applying an appropriate amount of digital gain. In some embodiments, the gain includes a gain based on long-term signal level estimate and a gain based on short-term signal level estimate. The gains are applied differently, depending on whether the AGC module has reached stable, converged stage, and based on other circumstances as will be described.

Example Environment of a Video Conferencing Application

Figure 1:
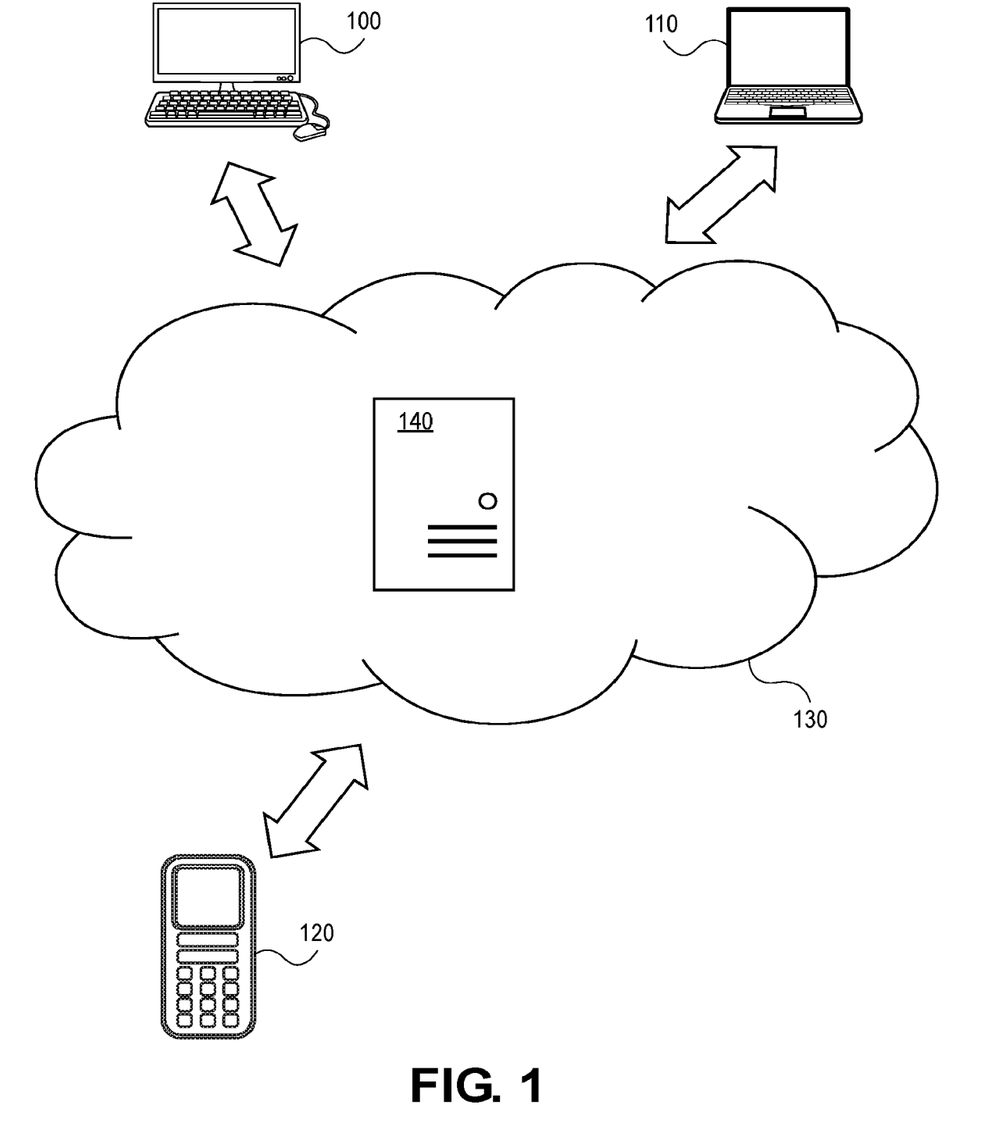
FIG. 1 illustrates a block diagram of a networked computer system within which an embodiment can be implemented.

FIG. 1 illustrates a networked computer system with which an embodiment may be implemented. In one approach, a server computer 140 is coupled to a network 130, which is also coupled to client computers 100, 110, 120. For purposes of illustrating a clear example, FIG. 1 shows a limited number of elements, but in practical embodiments there may be any number of the elements shown in FIG. 1. For example, the server computer 140 may represent an instance of a server computer running one or more application servers among a large plurality of instances of application servers in a data center, cloud computing environment, or other mass computing environment. There also may be hundreds, thousands or millions of client computers.

In an embodiment, the server computer 140 hosts a video conferencing meeting, transmits and receives video, image, and audio data to and from each of the client computers 100, 110, 120.

Each of the client computers 100, 110, 120 can be a computing device having a central processing unit (CPU), graphics processing unit (GPU), one or more buses, memory organized as volatile and/or nonvolatile storage, one or more data input devices, I/O interfaces and output devices such as loudspeakers, headphones, headsets, and LINE-OUT jack and associated software drivers. Each of the client computers 100, 110, 120 may include an integrated or separate display unit such as a computer screen, touch screen, TV screen or other display. Client computers 100, 110, 120 may comprise any of mobile or stationary computers including desktop computers, laptops, netbooks, ultrabooks, tablet computers, smartphones, etc. The GPU and CPU can each manage separate hardware memory spaces. For example, CPU memory may be used primarily for storing program instructions and data associated with application programs, whereas GPU memory may have a high-speed bus connection to the GPU and may be directly mapped to row/column drivers or driver circuits associated with a liquid crystal display (LCD), organic light emitting diode (OLED) or other display technology that serves as the display. In one embodiment, the network 130 is the Internet.

Each of the client computers 100, 110, 120 hosts, in an embodiment, a video conferencing application that allows each of the client computers 100, 110, 120 to communicate with the server computer 140. In an embodiment, the server computer 140 may maintain a plurality of user accounts, each associated with one of the client computers 100, 110, 120 and/or one or more users of the client computers.

Among other functions, the video conferencing application running on client computers can capture audio and transmit it to the server computer 140. The audio signal is generally captured having a variety of characteristics and parameters. The audio signal captured by the client device is converted into a digital audio signal, which can have a signal level. "Level" in an audio signal can be equivalent to an audio signal volume as perceived by a human. Digital signal level also relates to another characteristic of an audio signal called gain. Gain can refer to an amount of signal level added to or subtracted from an audio signal. Signal level, gain, and similar terminology, in this context can be expressed in units of decibel (dB). A related concept is dBov, or dBO, otherwise known as dB overload and can refer to a signal level or gain level, usually audio, that a device can handle before clipping occurs.

Two-Stage AGC

In video conferencing it can be desirable to maintain a stable audio signal level and/or audio signal level gain. This will help the computer server 140 or other recipient client computers to receive consistent audio and produce a more pleasant auditory experience for a recipient of the audio signal. To that end, an automatic gain control (AGC) module can be embedded in the video conferencing applications running on client computers 100, 110 and 120 to control the gain and signal level of a captured audio signal. Below, several embodiments of AGC modules, which can be embedded in client computers 100, 110 and 120, will be described.

Figure 2:
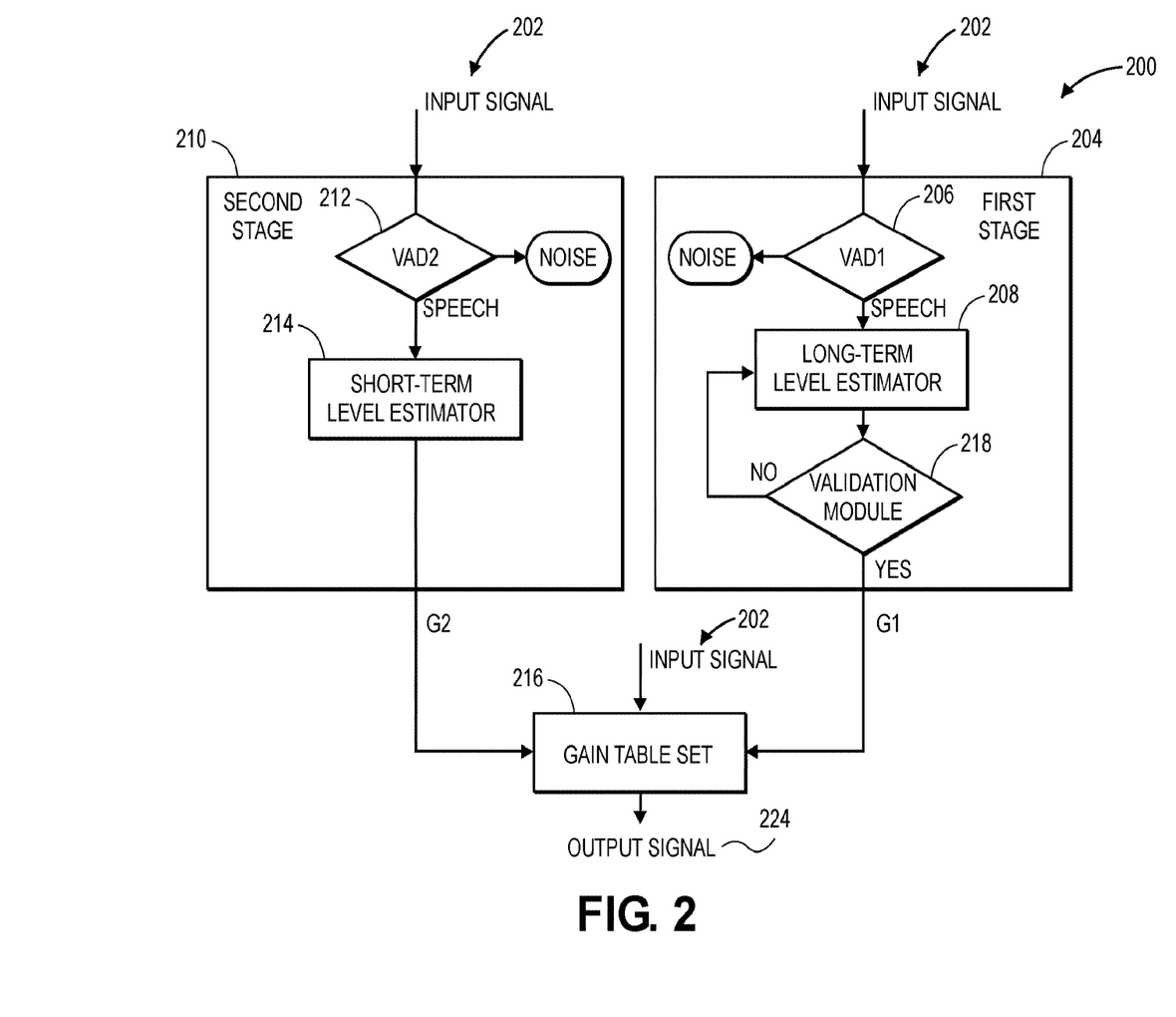
FIG. 2 illustrates a two-stage automatic gain control (AGC) according to an embodiment.

FIG. 2 illustrates a two-stage automatic gain control (AGC) 200 according to an embodiment. An input signal 202, of unknown and potentially variable speech level is processed with and through the AGC 200 and an output signal 224 of a known target voice level 224 is generated. The output signal 224, generated at a known target level, can be transmitted to the server computer 140 and subsequently to downstream client computers 100, 110, 120. The output signal 224 can be generated at a target level that is suitable for high quality transmission and for generating a pleasant auditory experience at the receiver end, without much noise or interference. In some embodiments, the target level within a video conferencing system can be determined empirically or by analyzing past recordings of video conferences across and between multiple devices, diverse microphones and varying conferencing parameters. In some embodiments, the target level for the output signal 224 can be −20 dB to −25 dB. This target level range in some embodiments can reduce or minimize the chance of transmitting a signal level that is too loud, and/or has undesirable clipping, echo or other characteristics. In some embodiments, the AGC 200 can be configured to intentionally miss the target level in order to reduce or minimize the chance of overamplification of the signal, which can be more deleterious to audio quality than under-amplification.

The input signal 202 can be fed through a first stage 204. In some embodiments, a first voice activity detector (VAD1) 206 can receive the input signal 202 and filter out the noise components, allowing the speech component of the input signal 202 to pass through to a long-term level estimator 208. The long-term level estimator 208 predicts the speech level for a future duration of time, for example for the next 2-5 seconds (s) of audio. In some embodiments, the result of the long-term level estimator 208 can be validated by a validation module 218. If the long-term estimate is valid, a first stage gain G1 can be generated and applied to the input signal 202 via a gain table set 216. Validation module 218 may perform statistical analysis on an input buffer to determine whether a long-term estimate should be trusted, so as to generate a corresponding first stage gain G1 to apply to the input signal 202.

The first stage gain G1 is generated based on the unknown and estimated variable of speech level. As a result, the amplified input signal due to first stage gain G1 may gradually convert to a desired target level. For example, in the beginning of a video conference, the long-term level estimator 208 may not have enough incoming audio data to produce a speech level estimate. In other situations, the underlying data to be buffered and processed in order to make a long-term speech level estimation can take a period of time to accumulate and process. For these and other reasons, the first stage gain G1 can take a period of time before it can amplify the input signal 202 to a desired target level of the output signal 224. The period of time in which the first stage is gradually increasing the signal level to a target level can be termed an unconverged period of time, unconverged status or state and the input signal level during the unconverged state can be termed the unconverged signal level. Alternatively, it can be said that the first stage gain has not stabilized or has not converged during the unconverged period of time. As will be described a second stage gain G2 produced by a second stage can assist the first stage gain to amplify the input signal 202 to the target level during the unconverged period of time. When the first gain G1 reaches a stable level where it can amplify the input signal 202 to the target level unassisted, the second stage gain G2 can be clipped to a minimum value (e.g., less than 5 dB). The period of time during which (or after which( ) the first stage gain G1 can amplify the input signal 202 to a desired target level, unassisted, can be termed the converged period of time, the converged status or state and the signal level during the converged period of time can be referred to as the converged level.

Stated otherwise, the first stage gain G1 is based on a long-term estimate calculation (e.g., 2-5 seconds of upcoming audio) and is therefore, a value that is determined gradually, is applied to the input signal 202 gradually and therefore amplifies the input signal 202 gradually. As will be described, the second stage gain G2 is determined based on a short-term signal level estimate (e.g., 200 milliseconds to 1.5 milliseconds), and as a result can convert the input signal 202 to the target level instantaneously, near-instantaneously, or with much less delay compared to the gain contribution from the first stage. The second stage gain G2 can be applied based on the present value of the first stage gain G1 to assist it in converting the input signal 202 to the target level. In other words, the sum of the first and second stage gains applied to the input signal 202 converts the input signal 202 to target level.

As discussed earlier, the second stage 210 can be used to assist the first stage 204 during the unconverged period of time or in other cases, where immediate or near immediate assistance to the first stage can be desirable to amplify the input signal 202 to a target level. As described earlier, the first stage gain G1 can implement a gradual amplification of the input signal 202 before it can converge and reach a stable state. During the unconverged state, without the assistance of the second stage, the transmitted audio can be below or above the target level resulting in undesirable or unpleasant auditory experience on the receiving end. The second stage 210 can be configured to receive the input signal 202 and make a short-term signal level estimation upon which a second stage gain G2 can be determined and applied to the input signal 202. The second stage gain G2 along with the present value of the first stage gain G1 can affect an immediate, near immediate or short-term amplification of the input signal 202 to a desired target level. In some embodiments, this can be implemented via the gain table set 216, which can receive the first and second stage gains G1, G2 and apply the sum of them to the input signal 202 to generate the output signal 224 at a desired target level.

In some embodiments, the second stage 210 can include a second voice activity detector (VAD2) 212, which filters out noise and interference and feeds the speech component of the input signal 202 to a short-term level estimator 214. To estimate a short-term speech level, the short-term level estimator 214 can analyze an interval of speech of a short duration of time, relative to the interval of speech which the long-term level estimator 208 processes. As described earlier, a short duration of time can be 200 milliseconds to 1.5 seconds. The second stage gain G2 can be generated based on the output of the short-term level estimator 214. In some embodiments, the short-term signal level estimate can be the mean of the speech levels in the speech interval analyzed by the short-term level estimator 214.

First and Second Voice Activity Detection Modules

As described earlier, both the first stage and second stage can utilize voice activity detectors to filter out noise and feed the voice component of the incoming audio to the short- and long-term level estimators. The first stage is configured to make a long-term estimate of the incoming audio, upon which a first stage gain G1 can be generated and applied for a relatively long duration of time, compared to the second stage gain contribution. For example, as will be described, once the first stage gain stabilizes and can convert the input signal 202 to a target level, unassisted, the second stage gain G2 is clipped to a minimum value. This is to maintain an overall stable gain (overall gain G=G1+G2). Once converged, the first stage gain G1 contributes all or the majority of the needed gain to amplify the input signal 202 to the target level and is applied for relatively longer time periods during the audio conference.

The first stage gain G1 is based on the long-term signal level of the voice component as outputted by the first voice activity detector (VAD1) 206. As a result, it is more desirable to configure the first voice activity detector (VAD1) to have a high noise rejection ratio and to produce an output that is more confidently voice (rather than noise). A high-noise rejection ratioVAD1 can reduce or minimize the chance that the long-term estimate and the resulting gain would be based on noise. This might cause VAD1 to miss some voice data, but its output is speech data with a high confidence (e.g., above 90%). By contrast, the short-term level estimator 214 responds quickly to speech data. As a result, it is more desirable that VAD2 212 have a high degree of speech sensitivity. While this can cause VAD2 to mistakenly characterize noise as speech data in some cases, it can also mean that VAD2 misses fewer (e.g., less than 10%) speech data.

Thus, in an embodiment, VAD1 is configured or chosen to be of a kind that has high noise rejection (more inclined to rejecting noise) and VAD2 is configured or chosen to be of a kind that has high voice sensitivity (more inclined to detecting speech). For example, VAD1 can be above 90% sensitive to rejecting noise, or its output is voice with 90% or more measure of confidence. VAD2 can be above 90% sensitive to detecting speech data, or its output is guaranteed or near guaranteed to capture 90% or more of the voice data in its input audio stream. The stated specifications and sensitivities are examples intended to illustrate the relationship between VAD1 and VAD2, and their respective configurations. A person of ordinary skill in the art can configure the AGC 200 with sensitivities and thresholds that differ from those stated above, but do not depart from the spirit of the disclosed technology.

Estimating a long-term signal level

Figure 3:
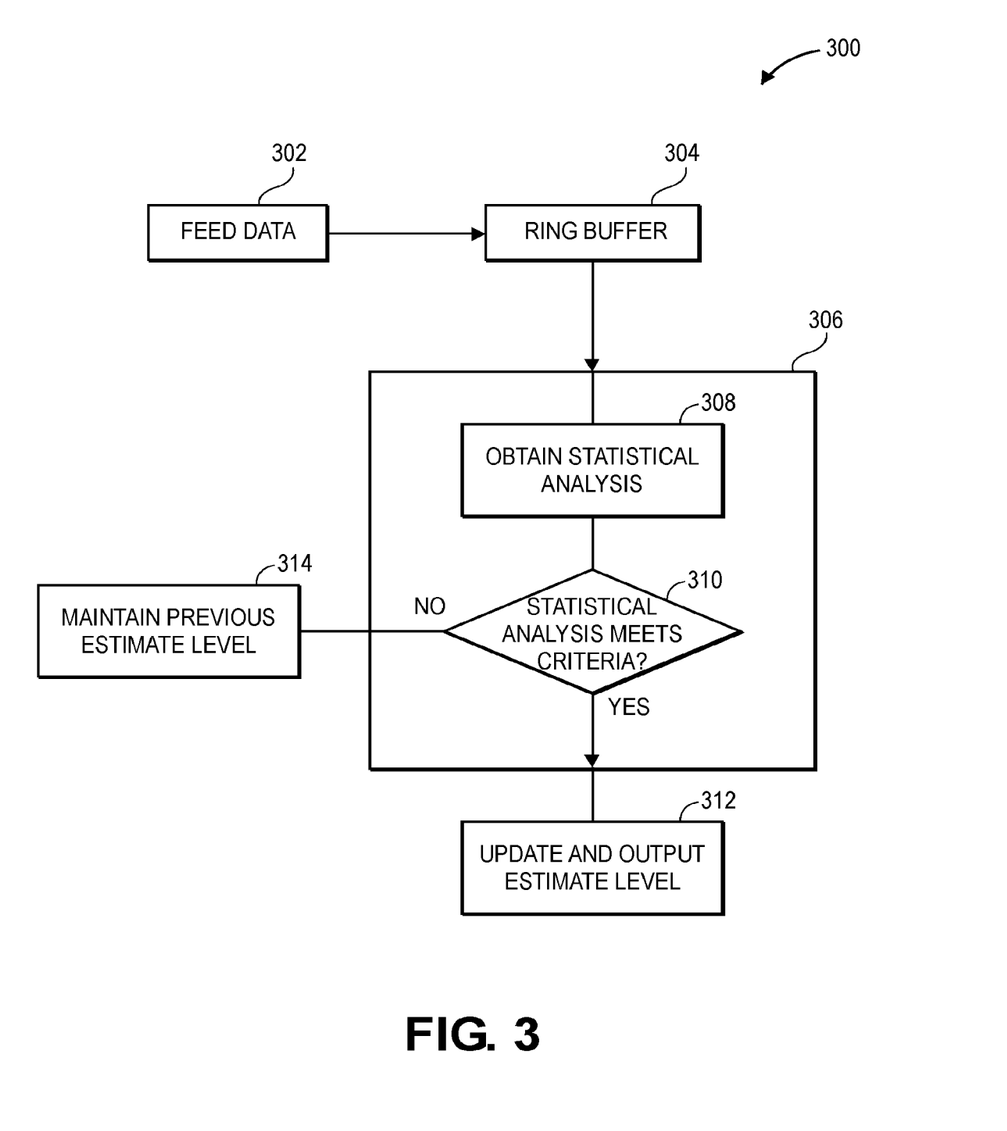
FIG. 3 illustrates a block diagram of a long-term level estimator according to an embodiment.

FIG. 3 illustrates a block diagram of a long-term level estimator 300 according to an embodiment. Feed data 302 can be a portion of the input signal 202, for example, a portion of the input signal 302 processed by the first voice activity detector 206, as discussed in relation to the embodiment of FIG. 2. In this scenario, the feed data 302 can include the speech component of the input signal 202 as processed by the first voice activity detector 206. The feed data 302 can accumulate in a buffer, such as the ring buffer 304. In some embodiments, the ring buffer 304 stores a predetermined window size of the incoming speech, such as the previously or most recently received 5 seconds of speech. The size of the ring buffer 304 can be determined empirically or based on analysis of other recorded video conferences to determine an appropriate buffer size that allows for efficient processing, transmission and auditory experience. In other embodiments, the size of the ring buffer can be determined by existing buffers within a video conferencing application. An example range of the sizes of the ring buffer 304, which can alternatively be referred to as the long-term buffer can be 2 to 5 seconds of the most recently received speech.

The feed data 302 may be received in intervals of speech shorter than the size of the ring buffer. For example, the feed data 302 can be received in 10 milliseconds (ms) intervals and accumulate in the ring buffer 304 on a rolling basis (e.g., first in, first out or FIFO). A statistical analysis unit 306 performs statistical analysis on the data in the ring buffer 304 and based on that analysis can generate a long-term signal level estimate (or it can update a previously generated signal level estimate). Alternatively, the statistical analysis unit 306 can maintain a previously generated long-term level estimate based on the result of its statistical analysis of the ring buffer 304.

In one embodiment, a statistical analysis module 308 can generate a histogram of the levels of audio signal data in the ring buffer 304. One method for obtaining the histogram levels can be by dividing the data in the ring buffer 304 into predetermined intervals (e.g., 2 ms) and calculating the root-mean-square (RMS) of each interval. The histogram levels can be used to obtain a Gaussian distribution of the signal levels in the ring buffer 304. The Gaussian distribution can be used to determine the validity of a long-term level estimate that can be obtained from the data in the ring buffer 304. The Gaussian distribution can indicate a new signal level estimate (e.g., the signal level at the mean). The Gaussian distribution can also be used to validate a recently derived estimate, as will be further described in relation to FIG. 4. At blocks 312, 314, the long-term level estimator 300 determines whether a previously determined signal level estimate is to be maintained (block 314) or whether a new signal level estimate should be used to update a previously estimated signal level (block 312).

Figure 4:
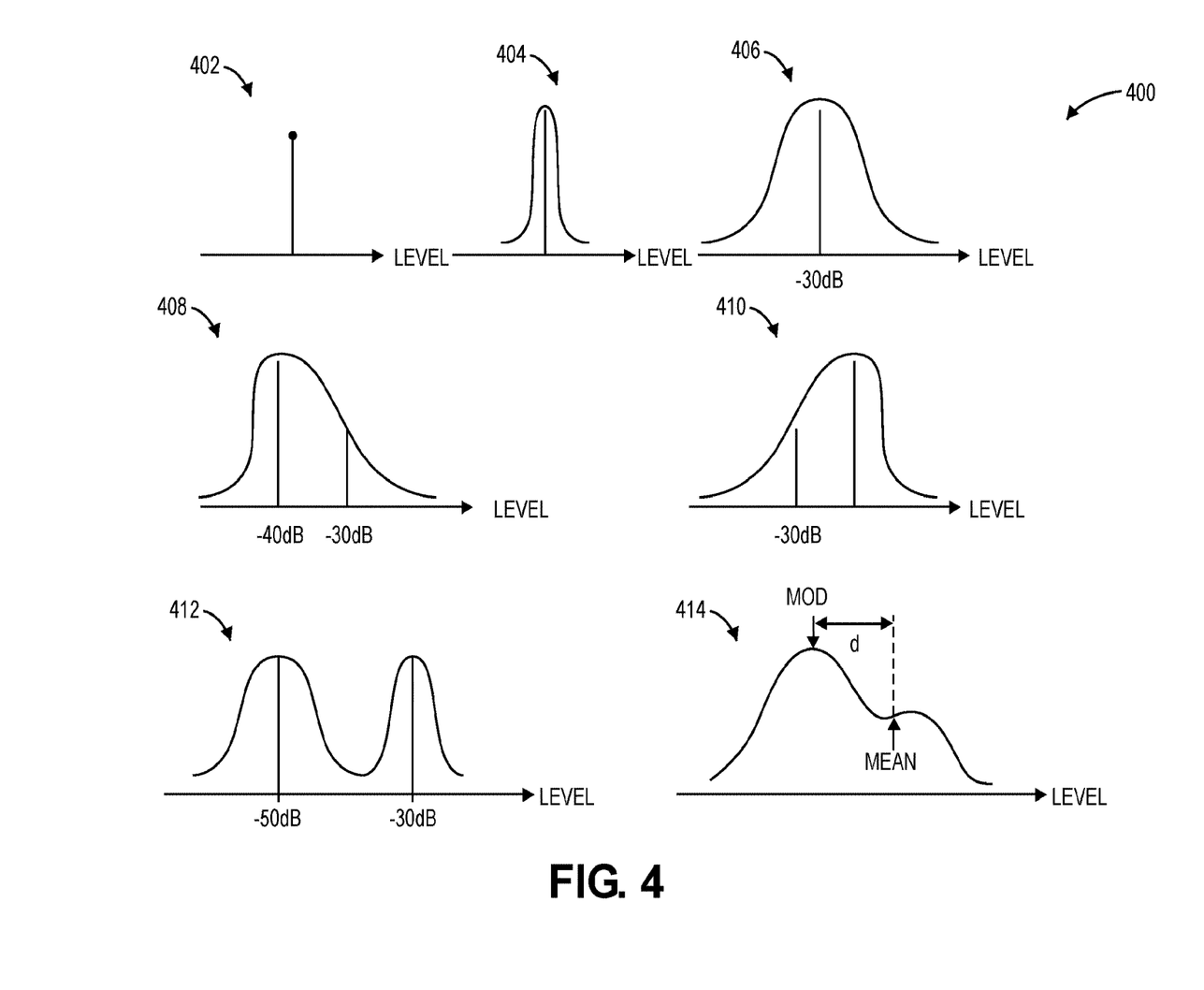
FIG. 4 illustrates graphs of some example Gaussian distributions that can exist in audio data.

FIG. 4 illustrates graphs 400 of some example Gaussian distributions that can exist in the ring buffer 304 data. Horizontal axis indicates signal level in dB and the vertical axis represents the distribution of the signal data having the signal level shown on the horizontal axis. Referencing both FIGS. 3 and 4, in graph 402, the feed data 302 is sparse (perhaps in the beginning of a video call session). In graphs 402 and 403 the feed data 302 begins to accumulate more in the ring buffer 304 and a more bell-shaped curve is observed in the Gaussian distribution of the data in the ring buffer 304. In some embodiments, the graph 406, showing a distinct peak around −30 dB can indicate that a valid long-term estimate can be obtained from the data in the ring buffer 406. The graphs 408 and 410 illustrate situations where the Gaussian distribution is skewed to the left or right, respectively, indicating perhaps a speaker has moved away or toward a microphone.

The first and second stage can be configured to respond to the situations presented in graphs 408 and 410, depending on whether the first stage is in the converged state or not. For example, in the unconverged state, the signal level corresponding to the signal level of a majority of the ring buffer 304 data can be chosen as the long-term estimate. In some embodiments, the mean or the mode can be chosen as the long-term signal level estimate. In the unconverged state, the long-term level estimator 300 can be configured with logic that responds to the left-skewed graph (e.g., 408) by not updating the signal level estimate, so as to reduce or minimize the chance of unintended overamplification. For the right-skewed Gaussian distribution, detected when the AGC 200 is in converged state, the AGC 200 can be configured to transition back to unconverged state to determine second stage gain to return the signal level to the target level.

Graph 412 can occur when audio streams from multiple speakers have been received in the ring buffer 304. In this scenario, the long-term level estimator 300 may be configured to disregard the new change in level estimation and not update the signal estimate level (block 314). Alternatively, it can use another statistically desirable parameter, such as the mean or the mod of the Gaussian distribution to update the signal level (block 312). Graph 414 illustrates a situation that might occur if noise or interference is present, when multiple distinct peaks in the Gaussian distribution can exist.

In some embodiments, the statistical analysis unit 306 can determine if the difference between the mean and the mod in a multi-peak Gaussian distribution exceeds a predetermined threshold (e.g., 5 dB) and refrain from generating a new long-term level estimate and/or retrain from updating the long-term level estimate when the distance between the mean and the mod exceeds that threshold. In this scenario, the long-term level estimator 300 executes the block 314 and maintains a previously determined long-term signal level estimate. In other words, a distance (more than a threshold) between the mean and the mod in the Gaussian distribution can indicate that the data integrity of the voice data in the ring-buffer 304 is not adequate enough to warrant changing a previously determined long-term signal level estimate.

Example Operations of the AGC

Figure 5:
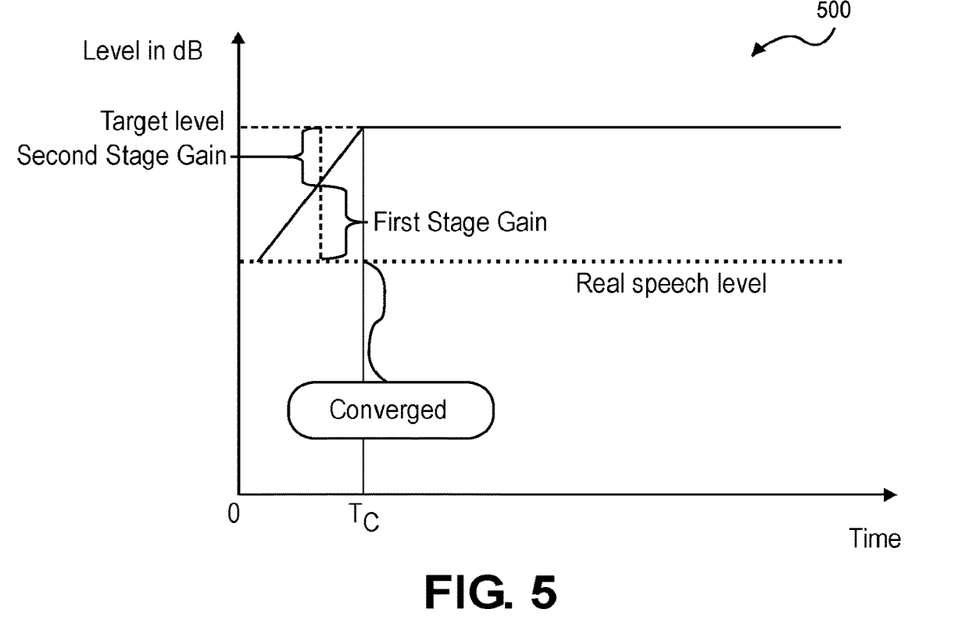
FIG. 5 illustrates a graph of various speech levels relative to a desired target level in a near ideal scenario.

FIG. 5 illustrates a graph 500 of various speech levels relative to a desired target level in a near ideal scenario, where real speech level and the estimated speech level are the same and remain constant during the period shown. The horizontal axis shows time, and the vertical axis shows speech (signal) level in dB. The graph 500 illustrates a situation where a positive gain is applied to the input signal 202 to amplify it to the target level, but the described embodiments can also apply to situations and input signals where the speech level (real speech level) is decreased by applying a negative gain, in order to reach a target speech level. During the unconverged state, from 0 to Tc (converged time), the first stage gain G1 gradually increments the input signal level (real speech level) toward the target level. During this period, the second stage gain G2 makes up for the amount of gain that is needed to amplify the input signal level to the target level. In other words, the sum of first and second stage gains (G1+G2) applied to the input signal level would convert the input signal level to the target level. During the unconverged period (0 to Tc), the first stage gain G1 is a parameter that gradually increases in absolute value in the total gain G and the second stage gain G2 is a parameter that gradually decreases in absolute value as more and more of the total or the majority gain (G) can be made up by the contribution from the first stage gain. Near or around the converged time (Tc), the second stage gain approaches near zero or a small value (e.g., less than 5 dB), while the gain due to the first stage G1 reaches a stable level that amplifies the input signal level to the target level, unassisted. The term amplification in the context of this description is used synonymously with depressing a signal and is used in the context of digital signal amplification, which is achieved by digitally adding or subtracting an appropriate amount of first stage and/or second stage gains G1 and G2 to a signal.

In some embodiments, the AGC 200 can be set in a converged state using the following technique. When the difference between the amplified signal and the target level is within or less than a threshold, for example 5 dB, a convergence counter is incremented. If the convergence counter reaches a value above a predetermined threshold (e.g., greater than 10-30), the AGC 200 and the first stage are put in converged mode. The mode can be stored in a state machine, memory or other storage component.

The second stage gain G2 can be prone to wide variation because it is based on a short-term estimate, which can be impacted by noise or interference. During the converged mode, the first stage gain G1 can become stable but the second stage gain G2 can still vary widely if unchecked. In some embodiments, when the AGC 200 is in the converged mode, the second stage gain G2 can be clipped to a value less than 5 dB to prevent or reduce the chance of the second stage gain G2 destabilizing the overall gain.

Additionally, to prevent the overall gain from multiple convergence, the last converged signal level can be recorded locally and compared with a new converged level before the corresponding gain is applied to the input signal. This can help prevent or reduce the overall gain from divergence in a noisy environment.

Figure 6:
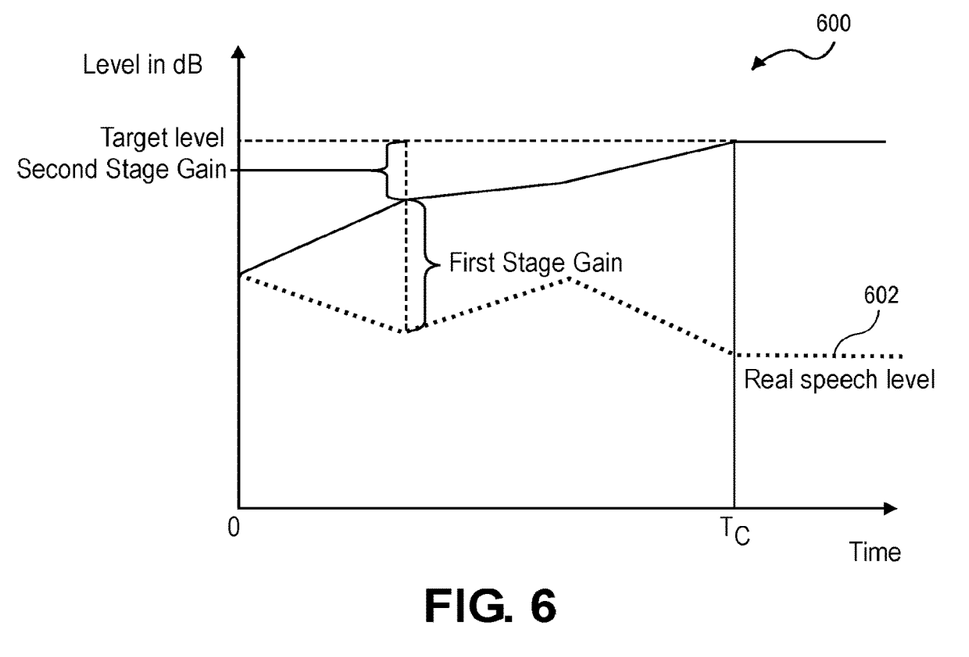
FIG. 6 illustrates a graph of the processing of a variable level speech according to an embodiment.

FIG. 6 illustrates a graph 600 of the processing of a variable level speech through the AGC 200. The real speech level 602 is a variable speech level as may be encountered in a typical video conference, where the speaker's voice level rises and falls. Before convergence time Tc, the first and second stage gains G1 and G2 together convert the input signal level (real speech level) 602 to the target level. The estimated signal level can closely track the real speech level from which the first stage gain G1 is generated and applied to the input signal level (real speech level) 602. The second stage gain G2 makes up the difference between the target level and the signal amplified by the first stage gain G1. When convergence time Tc is reached, the first stage gain G1 has reached a stable value and can maintain the amplification of the input signal level 602 to the target level, entirely or almost entirely unassisted. The second stage gain G2 can be clipped to a value less than a threshold such as 5 dB or less to keep the overall gain stable.

In some scenarios, it may be desirable to avoid amplifying the input signal to the target level. For example, when the AGC 200 has already reached convergence (time>Tc), when a speaker moves away from the microphone, the first and second stage gains G1, G2 can react to and increase the applied gain to amplify the now lower-level input signal to the target level. However, this scenario in some cases can lead to re-convergence to a loud signal level above the target level. In general, loud signals and over-amplified signals can create more unpleasant auditory experiences and may be more challenging to correct. For this scenario, where the AGC 200 is already in converged mode, and when the input signal level drops, the AGC 200 can be configured to not react to the drop in signal level and to not increase the gains G1 and/or G2. For example, the long-term estimator module 300 can be configured to not update the estimated speech level when the AGC 200 is in converged mode and the speech level drops below the converged level. This scenario is illustrated in FIG. 7.

Figure 7:
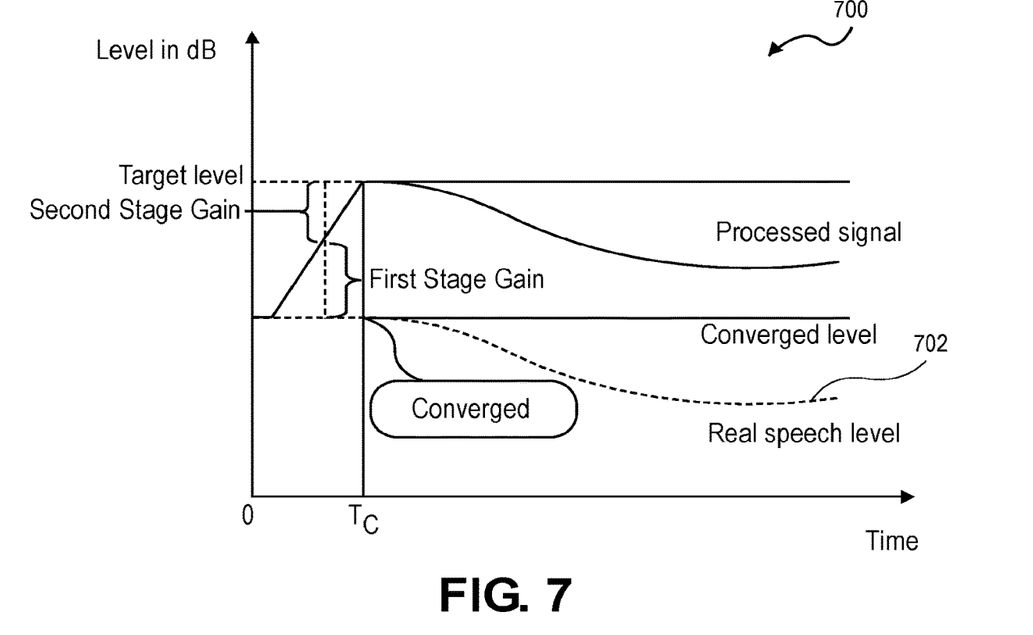
FIG. 7 illustrates a graph of a scenario when the AGC is in a converged state and the input signal starts to fall off below its most-recently estimated speech level.

FIG. 7 illustrates a graph 700 of a scenario when the AGC 200 is in a converged state and the input signal starts to fall off below its most-recently estimated speech level (converged level). In this example, the first stage gain stabilizes at convergence time Tc and the processed signal (input signal plus G1+G2) is at target level at the convergence time. A short time thereafter, the real speech level 702 starts falling below the converged level. In this scenario, an exception can be coded in the operation of the long-term estimator module 300, where the long-term estimate is not updated when the speech level begins to fall off during an already-converged period of time. For example, the long-term estimator module can discard the new long-term estimate corresponding to the falling speech level and consequently, the AGC 200 would continue to apply the previous value of the first stage gain G1, which had previously stabilized at the convergence time Tc. Without coding this exception, the long-term estimator 300 would update the long-term speech level estimate causing the AGC 200 to transition out of the converged state and generate new values for G1 and G2 until the fallen speech level is restored to the target level. In other words, without the exception, the AGC 200 would try to reach the target level by applying newly calculated gain values, which can lead to multiple convergence and loud audio if the speaker quickly moves back to a prior position, leading to overamplification of the input signal.

When the exception, as described above is coded, the processed signal (real speech level plus the gain) is allowed to fall below target level. This is acceptable since a signal level below the target level is less prone to audio processing problems than a potentially loud signal.

In some embodiments, the exception related to the falling signal level can be coded in the logic implementing the behavior of the long-term level estimator 300. For example, the source code implementing the functionality of the long-term level estimator 300 can include conditional lines of code that detect conditions, such as the AGC 200 being in a converged state and a falling of the input signal below the converged level. When the conditions are satisfied, the long-term level estimator 300 would not update and output new speech level estimates; instead, it maintains the previous speech estimate levels, leading the AGC 200 to not change the values of the first and second stage gains G1, G2.

Figure 8:
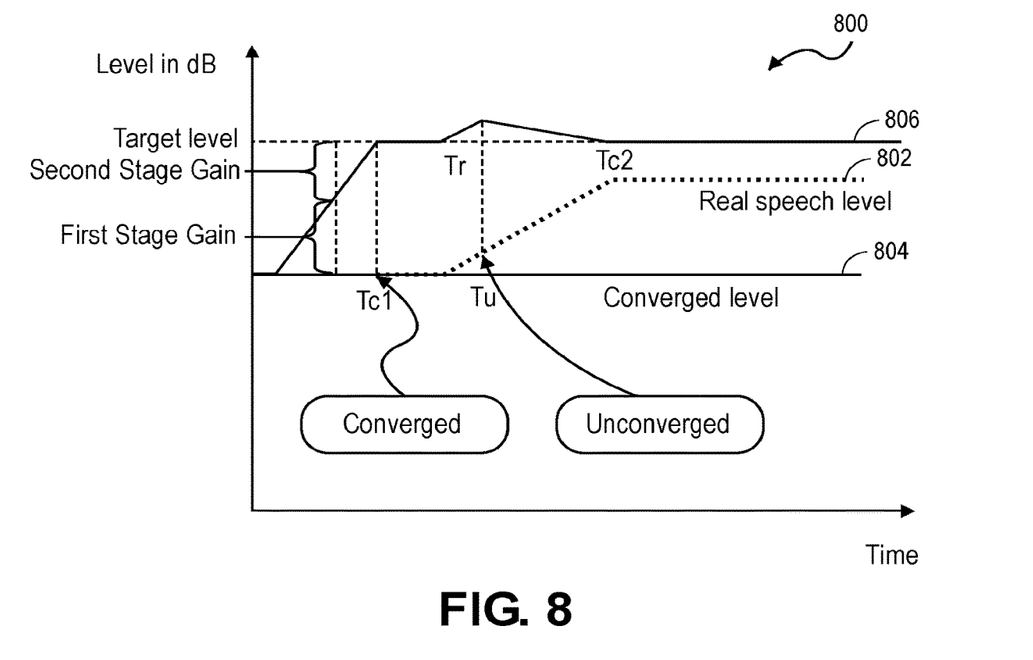
FIG. 8 illustrates an example operation of the AGC in convergence state and when an input signal level rises above a previous estimated level.

Another exception can be coded and relates to when the real speech level rises above the converged level when the AGC 200 is in converged state. In this instance, the AGC 200 can be configured to restore the amplified signal to the target level by applying appropriate, newly calculated values of the first and second stage gains G1 and G2.

FIG. 8 illustrates a graph 800 of a scenario when the AGC 200 has reached a converged state at the first convergence time Tc1. The real speech level 802 is at the converged level 804. The converged level 804 is the same as or based on the most recently estimated speech level. During the converged state, the first stage gain G1 amplifies the input signal (real speech level) to the target level. The second stage gain G2 is clipped to a minimum value (e.g., below 5 dB). Consequently, the majority of the gain contribution is from the first stage gain G1.

At Tr (rise time), the real speech level 802 starts to rise above the converged level 804 and the input signal (real speech level 802) starts to rise above its most-recently estimated speech level (converged level 804). Consequently, the first stage gain amplifies the input signal to a level higher than the target level. The AGC 200 can be configured to detect these circumstances and transition from the converged mode to unconverged mode. Transitioning to unconverged mode, allows the second stage gain to be unclipped and to start applying the second stage gain G2 values that restore the input signal to the target level. The graph 800 illustrates a momentary rise in the processed signal level above the target level between times Tr (rise time) and Tu (unconverged time). At Tu, the second stage gain G2 returns online and starts applying gain values to restore the input signal to the target level, which is accomplished at the second converged time (Tc2). During this time, the first stage gain values G1 will be recalculated and updated to reflect the real speech level 802. Subsequently, the first stage gain G1 will gradually stabilize, and at or near the second convergence time Tc2, the first stage gain G1 contributes substantially to the overall gain amplifying the signal to the target level, unassisted. The second stage gain G2 can be clipped again to a minimum value (e.g., less than 5 dB) at or a time near the second convergence time Tc2.

Without changing the mode on the AGC 200 from converged to unconverged mode, the second stage gain G2 remains clipped to a minimum value and the first stage gain pushes the input signal above the target level. As described earlier, a loud or over-amplified signal is undesirable in some circumstances. An AGC 200 configured as described herein can avoid or reduce the chance of signal over-amplification. The mode switching between converged state and unconverged state can be accomplished by a state machine implemented in the AGC 200.

Figure 9:
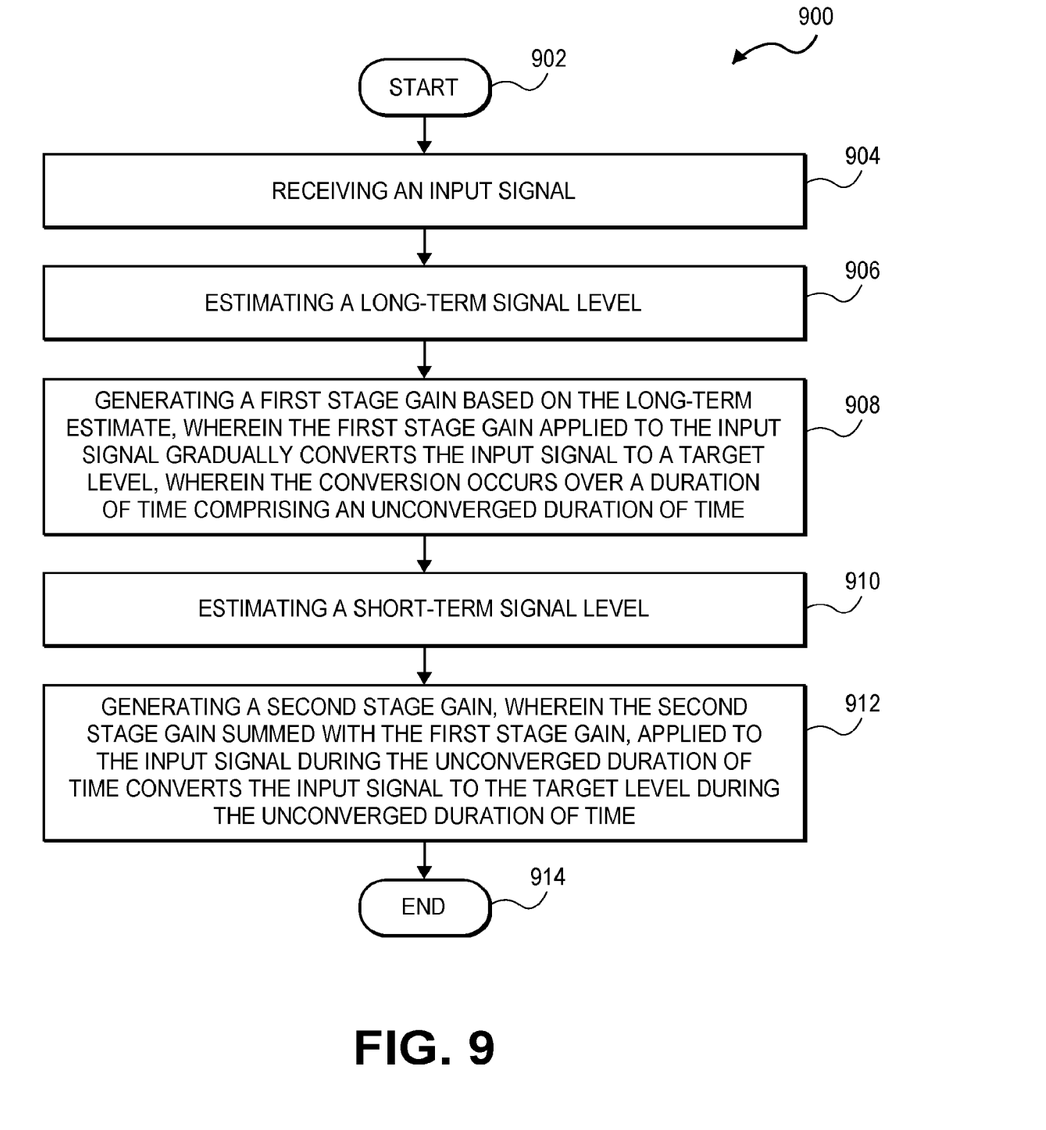
FIG. 9 illustrates a flow chart of a method of automatic gain control in a video conferencing application according to an embodiment.

FIG. 9 illustrates a flow chart of a method 900 of automatic gain control in a video conferencing application according to an embodiment. The method 900 starts at the step 902. At step 904, the method includes receiving an input signal. At step 906, the method includes estimating a long-term signal level. At step 908, the method includes generating a first stage gain based on the long-term estimate, wherein the first stage gain applied to the input signal gradually converts the input signal to a target level, wherein the conversion occurs over a duration of time comprising an unconverged duration of time. At step 910, the method includes estimating a short-term signal level. At step 912, the method includes generating a second stage gain, wherein the second stage gain summed with the first stage gain, applied to the input signal during the unconverged duration of time converts the input signal to the target level during the unconverged duration of time. The method ends at step 914.

Example Implementation Mechanism Hardware Overview

Some embodiments are implemented by a computer system or a network of computer systems. A computer system may include a processor, a memory, and a non-transitory computer-readable medium. The memory and non-transitory medium may store instructions for performing methods, steps and techniques described herein.

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be server computers, cloud computing computers, desktop computer systems, portable computer systems, handheld devices, networking devices or any other device that incorporates hard-wired and/or program logic to implement the techniques.

Figure 10:
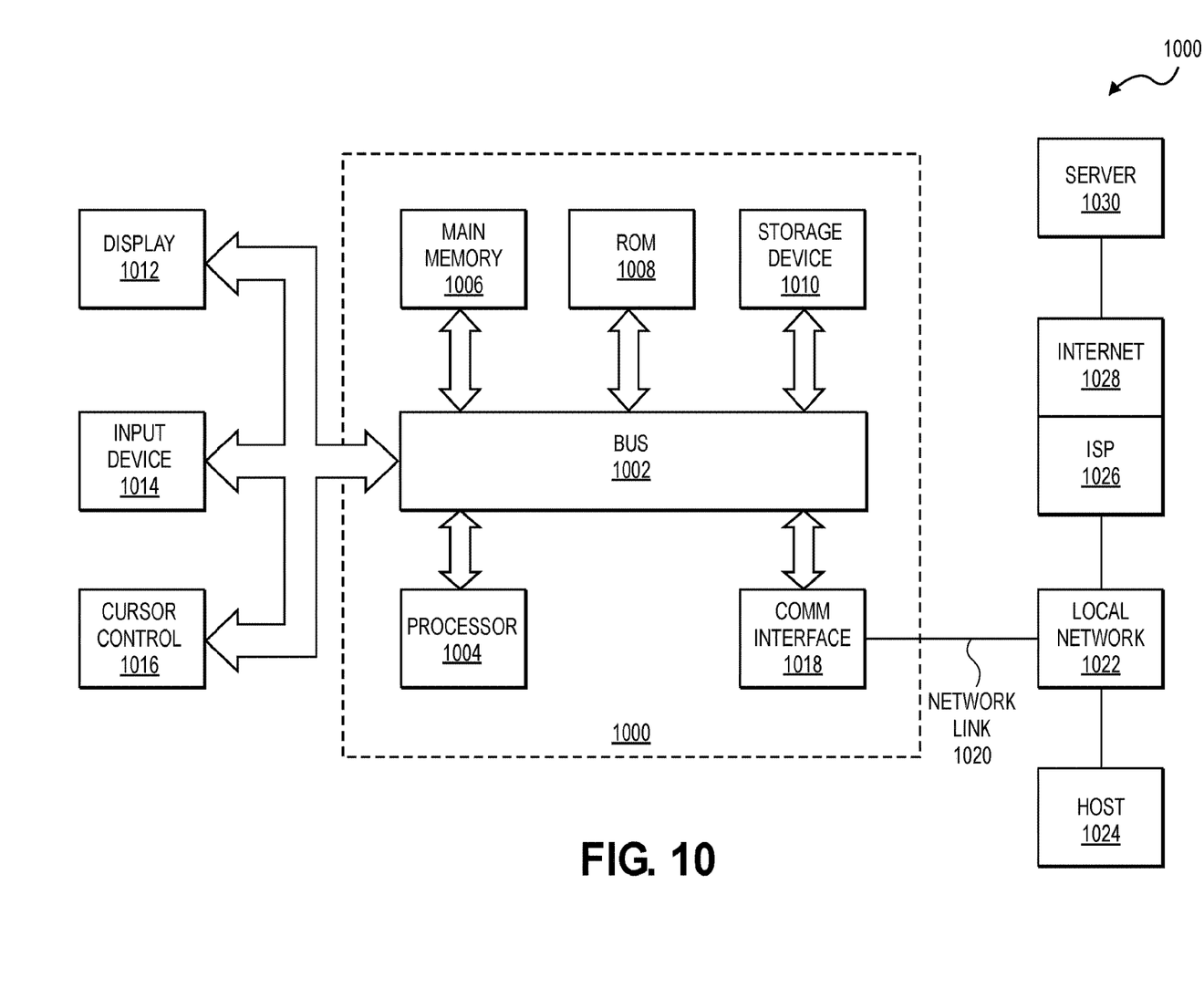
FIG. 10 illustrates an environment in which some embodiments may operate.

For example, FIG. 10 is a block diagram that illustrates a computer system 1000 upon which an embodiment of can be implemented. Computer system 1000 includes a bus 1002 or other communication mechanism for communicating information, and a hardware processor 1004 coupled with bus 1002 for processing information. Hardware processor 1004 may be, for example, special-purpose microprocessor optimized for handling audio and video streams generated, transmitted or received in video conferencing architectures.

Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Such instructions, when stored in non-transitory storage media accessible to processor 1004, render computer system 1000 into a special-purpose machine that is customized to perform the operations specified in the instructions.

Computer system 1000 further includes a read only memory (ROM) 1008 or other static storage device coupled to bus 1002 for storing static information and instructions for processor 1004. A storage device 1010, such as a magnetic disk, optical disk, or solid state disk is provided and coupled to bus 1002 for storing information and instructions.

Computer system 1000 may be coupled via bus 1002 to a display 1012, such as a cathode ray tube (CRT), liquid crystal display (LCD), organic light-emitting diode (OLED), or a touchscreen for displaying information to a computer user. An input device 1014, including alphanumeric and other keys (e.g., in a touch screen display) is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane. In some embodiments, the user input device 1014 and/or the cursor control 1016 can be implemented in the display 1012 for example, via a touchscreen interface that serves as both output display and input device.

Computer system 1000 may implement the techniques described herein using customized hard-wired logic, one or more ASICs or FPGAs, firmware and/or program logic which in combination with the computer system causes or programs computer system 1000 to be a special-purpose machine. According to one embodiment, the techniques herein are performed by computer system 1000 in response to processor 1004 executing one or more sequences of one or more instructions contained in main memory 1006. Such instructions may be read into main memory 1006 from another storage medium, such as storage device 1010. Execution of the sequences of instructions contained in main memory 1006 causes processor 1004 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical, magnetic, and/or solid-state disks, such as storage device 1010. Volatile media includes dynamic memory, such as main memory 1006. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1002. Transmission media can also take the form of acoustic or light waves, such as those generated during radio-wave and infra-red data communications.

Various forms of media may be involved in carrying one or more sequences of one or more instructions to processor 1004 for execution. For example, the instructions may initially be carried on a magnetic disk or solid state drive of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card, cable modem, satellite modem, or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the world wide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are example forms of transmission media.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018.

The received code may be executed by processor 1004 as it is received, and/or stored in storage device 1010, or other non-volatile storage for later execution.

While the invention has been particularly shown and described with reference to specific embodiments thereof, it should be understood that changes in the form and details of the disclosed embodiments may be made without departing from the scope of the invention. Although various advantages, aspects, and objects of the present invention have been discussed herein with reference to various embodiments, it will be understood that the scope of the invention should not be limited by reference to such advantages, aspects, and objects. Rather, the scope of the invention should be determined with reference to patent claims.

What is claimed is:

1. A method for generating a long-term signal level estimate, comprising:
   receiving an input signal comprising feed data, the input signal derived from an upstream input signal;
   selecting a first subset of the feed data;
   dividing the first subset of the feed data into a plurality of analysis intervals;
   calculating a statistical average of each analysis interval;
   generating a first Gaussian distribution based on the statistical average of each analysis interval of the plurality of analysis intervals;
   determining the long-term signal level estimate based on one or more characteristics of the first Gaussian distribution;
   generating a first stage gain based on the long-term signal level estimate; and
   applying the first stage gain to the input signal.

2. The method of claim 1, further comprising writing the feed data to a long-term buffer, wherein the first subset of the feed data is selected from the long-term buffer, wherein the long-term buffer is a ring buffer.

3. The method of claim 2, wherein:
   the feed data is received in intervals of a fixed duration; and
   and the feed data accumulates in the ring buffer on a rolling basis.

4. The method of claim 1, wherein the statistical average is a root-mean-square (RMS) calculation.

5. The method of claim 1, wherein the first stage gain gradually converts the input signal to a target level, wherein converting the input signal occurs over a duration of time comprising an unconverged duration of time.

6. The method of claim 1, wherein generating the first Gaussian distribution based on the statistical average of each analysis interval comprises:
   generating a first histogram based on the statistical average of each analysis interval; and
   generating the first Gaussian distribution from the first histogram.

7. The method of claim 1, wherein:
   the feed data comprises a speech component of the upstream input signal; and
   the input signal is generated by filtering a noise component out of the upstream input signal using a voice activity detector.

8. The method of claim 1, wherein the analysis intervals comprise a predetermined duration, wherein the predetermined duration is about 2 milliseconds.

9. The method of claim 1, further comprising:
   selecting a second subset of the feed data;
   dividing the second subset of the feed data into a second plurality of analysis intervals;
   calculating a second statistical average of each analysis interval of the second plurality of analysis intervals;
   generating a second Gaussian distribution based on the second statistical average of each analysis interval of the second plurality of analysis intervals;
   validating the long-term signal level estimate based on a comparison of one or more characteristics of the first Gaussian distribution to the respective one or more characteristics of the second Gaussian distribution; and determining a change to the long-term signal level estimate based on the comparison of one or more characteristics of the first Gaussian distribution to the respective one or more characteristics of the second Gaussian distribution.

10. The method of claim 1, wherein one or more characteristics of the first Gaussian distribution include the mean or the mode of the first Gaussian distribution.

11. The method of claim 1, further comprising:
determining, from a skew characteristic of the first Gaussian distribution, a left-skewed state; and
responsive to the left-skewed state, delaying the determination of the long-term signal level estimate.

12. The method of claim 1, further comprising:
identifying multiple peaks in the first Gaussian distribution; and
responsive to the multiple peaks, discarding the long-term signal level estimate.

13. The method of claim 1, further comprising:
identifying multiple overlapping peaks in the first Gaussian distribution; and
responsive to the multiple overlapping peaks, determining the long-term signal level estimate based on a mean and a mode of the first Gaussian distribution.

14. The method of claim 13, further comprising:
determining a first difference between the mean and the mode of the first Gaussian distribution;
responsive to the first difference exceeding a predetermined threshold, delaying the determination of the long-term signal level estimate;
selecting a second subset of the feed data;
dividing the second subset of the feed data into a second plurality of analysis intervals;
calculating a second statistical average of each analysis interval of the second plurality of analysis intervals;
generating a second Gaussian distribution based on the second statistical average of each analysis interval of the second plurality of analysis intervals;
determining a second difference between the mean and the mode of the second Gaussian distribution; and
responsive to the second difference being below the predetermined threshold, determining the long-term signal level estimate.

15. A non-transitory computer-readable medium storing instructions that, when executed by one or more processors, cause the one or more processors to perform operations including:
receiving an input signal, comprising feed data, the input signal derived from an upstream input signal;
selecting a first subset of the feed data;
dividing the first subset of the feed data into a plurality of analysis intervals;
calculating a statistical average of each analysis interval;
generating a first Gaussian distribution based on the statistical average of each analysis interval of the plurality of analysis intervals;

determining a potential long-term signal level estimate based on one or more characteristics of the first Gaussian distribution;
generating a first stage gain based on the potential long-term signal level estimate; and
applying the first stage gain to the input signal.

16. The non-transitory computer-readable medium of claim 15, further comprising:
determining a difference between the potential long-term signal level estimate and a current long-term signal level estimate; and
responsive the difference exceeding a predefined threshold, designating the potential long-term signal level estimate as the current long-term signal level estimate.

17. The non-transitory computer-readable medium of claim 15, further comprising:
identifying multiple peaks in the first Gaussian distribution;
determining the mean and the mode of the first Gaussian distribution;
determining a difference between the mean and the mode of the first Gaussian distribution; and
responsive the difference exceeding a predefined threshold, discarding the potential long-term signal level estimate.

18. The non-transitory computer-readable medium of claim 17, wherein a current long-term signal level estimate is not updated until the difference recedes below the predefined threshold.

19. A system comprising:
one or more processors; and
one or more computer-readable storage media storing instructions which, when executed by the one or more processors, cause the one or more processors to perform operations including:
receiving an input signal, comprising feed data, the input signal derived from an upstream input signal;
selecting a first subset of the feed data;
dividing the first subset of the feed data into a plurality of analysis intervals;
calculating a statistical average of each analysis interval;
generating a first Gaussian distribution based on the statistical average of each analysis interval of the plurality of analysis intervals;
determining a long-term signal level estimate based on one or more characteristics of the first Gaussian distribution;
generating a first stage gain based on the long-term signal level estimate; and
applying the first stage gain to the input signal.

20. The system of claim 19, wherein the system further comprises a statistical analysis unit, wherein the statistical analysis unit determines the long-term signal level estimate.

* * * * *